US012805208B2

(12) United States Patent
Kim

(10) Patent No.: US 12,805,208 B2
(45) Date of Patent: Nov. 17, 2026

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Jung Nam Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 337 days.

(21) Appl. No.: 18/750,286

(22) Filed: Jun. 21, 2024

(65) Prior Publication Data

US 2025/0301925 A1 Sep. 25, 2025

(30) Foreign Application Priority Data

Mar. 25, 2024 (KR) ........................ 10-2024-0040652

(51) Int. Cl.

*H10N 70/00* (2023.01)
*H10B 63/00* (2023.01)
*H10N 70/20* (2023.01)

(52) U.S. Cl.

CPC ......... *H10N 70/8418* (2023.02); *H10B 63/80* (2023.02); *H10N 70/023* (2023.02); *H10N 70/24* (2023.02)

(58) Field of Classification Search

CPC .. H10N 70/8418; H10N 70/023; H10N 70/24; H10N 70/011; H10N 70/826; H10N 70/841; H10N 70/8833; H10N 70/801; H10N 70/883; H10B 63/80; H10B 63/00; H10B 63/20

See application file for complete search history.

(56) References Cited

U.S. PATENT DOCUMENTS

2013/0043523 A1* 2/2013 Ohno ..................... H10B 41/35 257/E21.21
2015/0236257 A1* 8/2015 Walls ................... H10N 70/826 257/3
2025/0241213 A1* 7/2025 Kwon .................... H10B 63/30

FOREIGN PATENT DOCUMENTS

KR 2014-0065942 A 5/2014
KR 2016-0124078 A 10/2016

* cited by examiner

*Primary Examiner* — Yasser A Abdelaziez

(57) ABSTRACT

A semiconductor device may include: a first electrode layer including a base and a plurality of protrusions protruding from the base; a switching layer extending along profiles of the plurality of protrusions; an oxygen reservoir layer located on the switching layer; a second electrode layer located on the oxygen reservoir layer; and an air gap located between the plurality of protrusions.

20 Claims, 16 Drawing Sheets

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119 to Korean Patent Application No. 10-2024-0040652 filed on Mar. 25, 2024 in the Korean Intellectual Property Office, which is incorporated herein by reference in its entirety.

BACKGROUND

1. Technical Field

Embodiments of the present disclosure relate to an electronic device, and more particularly, to a semiconductor device and a method of manufacturing the semiconductor device.

2. Related Art

Recently, in accordance with miniaturization, low power consumption, performance improvement, and diversification of electronic devices, semiconductor devices capable of storing information have been demanded in various electronic devices such as computers and portable communication devices. Accordingly, research into a semiconductor device capable of storing data using characteristics of switching between different resistance states depending on an applied voltage or current has been conducted. Examples of such a semiconductor device include a resistive random access memory (RRAM), a phase-change random access memory (PRAM), a ferroelectric random access memory (FRAM), a magnetic random access memory (MRAM), and the like.

SUMMARY

In an embodiment, a semiconductor device may include: a first electrode layer including a base and a plurality of protrusions; a switching layer disposed to contact a portion of an upper surface of each of the plurality of protrusions; an oxygen reservoir layer disposed on the switching layer; a second electrode layer disposed on the oxygen reservoir layer; and an air gap common to the plurality of protrusions.

In an embodiment, a manufacturing method of a semiconductor device may include: forming a first electrode layer including a base and a plurality of protrusions protruding from the base; forming a switching layer that contacts upper profiles of the plurality of protrusions; forming an oxygen reservoir layer on the switching layer; and forming a second electrode layer on the oxygen reservoir layer, wherein an air gap is defined by sidewalls of the plurality of protrusions.

DETAILED DESCRIPTION

Various embodiments are directed to a semiconductor device having a stable structure and improved characteristics and a method of manufacturing the semiconductor device.

It is possible to improve the degree of integration, operating characteristics, and reliability of a disclosed semiconductor device.

Hereafter, embodiments in accordance with the technical spirit of the present disclosure will be described with reference to the accompanying drawings.

Figure 1A:
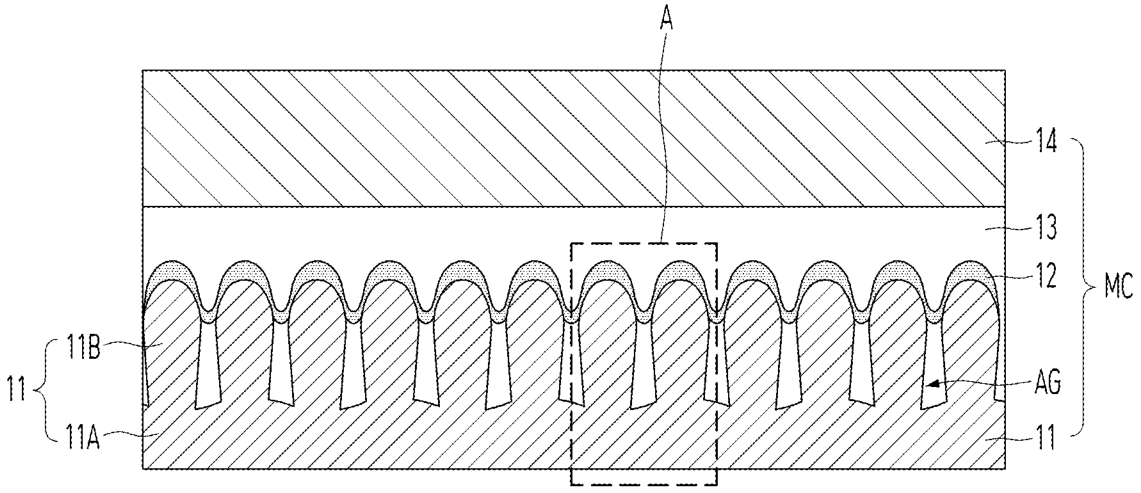
FIGS. 1A to 1C are diagrams illustrating a structure of a semiconductor device in accordance with an embodiment of the disclosure.
Figure 1B:
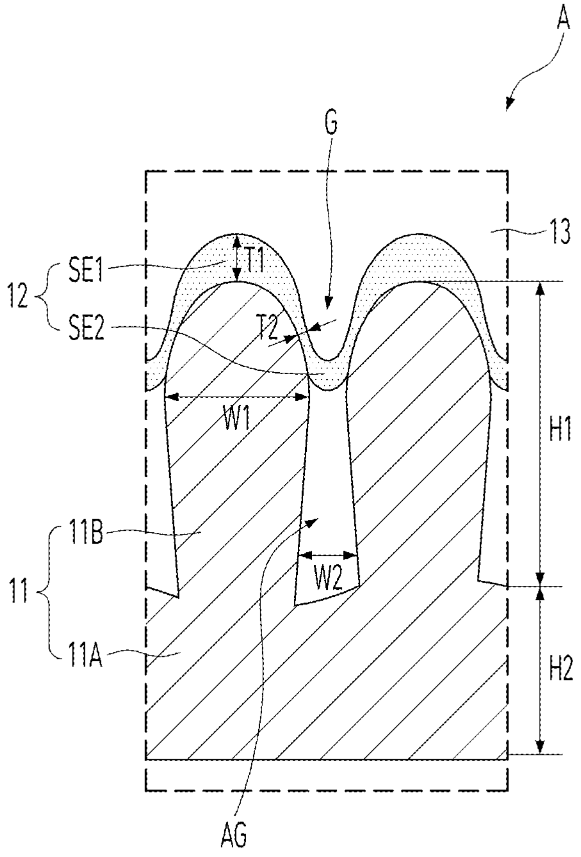
Figure 1C:
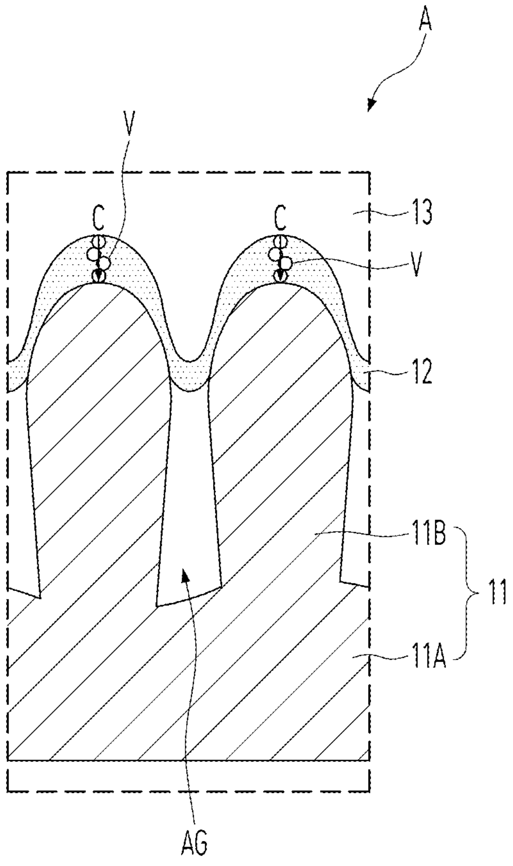

FIGS. 1A to 1C are diagrams illustrating a structure of a semiconductor device in accordance with an embodiment of the disclosure. FIGS. 1B and 1C are enlarged views of region A of FIG. 1A.

Referring to FIGS. 1A and 1B, a semiconductor device may include a first electrode layer 11, a switching layer 12, an oxygen reservoir layer 13, a second electrode layer 14, and an air gap AG. Here, the semiconductor device may be a resistive memory device.

The first electrode layer 11 may include a plurality of protrusions 11B. As an example, the first electrode layer 11 may include a base 11A and a plurality of protrusions 11B protruding from the base 11A. The plurality of protrusions 11B may be arranged to be spaced apart from each other on an upper surface of the base 11A, and may protrude vertically from the upper surface. A height H1 of the protrusion 11B may be greater than a height H2 of the base 11A. Each protrusion 11B may have a shape in which the height H1 thereof is greater than a width W1 thereof, for example, a shape with a high aspect ratio. An interval W2 between the protrusions 11B may be smaller than the width W1 of the protrusion 11B.

The first electrode layer 11 may be a conductive layer, and may include metal or metal nitride. Here, the metal included in the first electrode layer 11 may be transition metal. As examples, the first electrode layer 11 may include TIN, TaN, HfN, or the like.

The switching layer 12 may have variable resistance characteristics in that the layer changes into different resistance states depending on a voltage or a current supplied through the first electrode layer 11 and the second electrode layer 14. The switching layer 12 may be a resistance switching layer. As an example, resistance of the switching layer 12 may change by generation and disappearance of conductive paths C. The conductive path C electrically connects the first electrode layer 11 and the second electrode layer 14 to each other, and is generated or disappears according to the movement of oxygen vacancies V. An oxygen vacancy V may be a lattice defect occurring because oxygen escapes from a location where oxygen should be bonded. The oxygen vacancy V may exhibit the same behavior as a particle having a positive charge, such as a hole. When the oxygen vacancies V are connected to each other, a conductive path C is generated, and when the oxygen vacancies V are disconnected from each other, the conductive path C disappears or become degraded. When the conductive path C is generated, the switching layer 12 may have a low resistance state, and when the conductive path C disappears, the switching layer 12 may have a high resistance state. For example, the conductive path C may be a conductive filament or a conductive bridge.

The switching layer 12 may extend along portions of the upper profiles of the plurality of protrusions 11B. The switching layer 12 may be disposed on the upper sidewalls of the plurality of protrusions 11B. The switching layer 12 may entirely or partially surround a surface of the first electrode layer 11. As an example, the switching layer 12 may surround upper surfaces and upper sidewalls of the plurality of protrusions 11B, but might not surround lower sidewalls of the plurality of protrusions 11B. The switching layer 12 might not surround a surface of the base 11A between the protrusions 11B.

The switching layer 12 may have different thicknesses. The switching layer 12 may include first sections SE1 respectively disposed on the top surfaces of the protrusions 11B and second sections SE2 connecting the first sections SE1 to each other. In FIG. 1B, a first section SE1 may have a round shape that is convex upward. The first section SE1 may have a greater thickness T1 as it becomes closer to a tip of the protrusion 11B, and may have a smaller thickness T2 as it becomes closer to the second section SE2. The second section SE2 may have a round shape that is convex downward. A groove G may be defined between the protrusions 11B by the second section SE2.

The switching layer 12 may be a layer formed by a deposition method or an oxidation method. The switching layer 12 may include metal oxide or metal oxynitride. Metal included in the switching layer 12 may be transition metal. As an example, the switching layer 12 may include metal such as Al, Si, Ti, Cr, Mn, Ni, Cu, Zn, Y, Zr, Nb, Hf, Ta, or W. The switching layer 12 may include $HfO_2$, $TiO_2$, $Al_2O_3$, $ZrO_2$, or the like.

The oxygen reservoir layer 13 may include oxygen vacancies necessary to facilitate the generation or the degradation of the conductive path C. During resistance switching driving of a memory cell MC, oxygen ions and/or the oxygen vacancies may be exchanged between the switching layer 12 and the oxygen reservoir layer 13. As an example, during a set operation, the conductive path C may be generated in the switching layer 12 by the oxygen vacancies supplied from the oxygen reservoir layer 13, and the switching layer 12 may be switched to the low resistance state. During a reset operation, the oxygen vacancies in the conductive path C may move to the oxygen reservoir layer 13, such that at least a portion of the conductive path C may electrically disconnect and the switching layer 12 may be switched to the high resistance state.

The oxygen reservoir layer 13 may be located on the switching layer 12. The oxygen reservoir layer 13 may extend along a profile of the switching layer 12. As an example, an upper surface of the switching layer 12 may include the groove G located between the protrusions 11B, and the groove G may be defined by the second section SE2. The oxygen reservoir layer 13 may fill the groove G.

A space between the protrusions 11B may be divided into an upper portion and a lower portion by the switching layer 12. The upper portion may correspond to the groove G and may be filled by the oxygen reservoir layer 13. The lower portion may be an empty space, and may be defined as an air gap AG. The oxygen reservoir layer 13 may include metal or metal oxide. As an example, the oxygen reservoir layer 13 may include Ti, Ta, Hf, or the like.

The second electrode layer 14 may be located on the oxygen reservoir layer 13. The second electrode layer 14 may include the same material as or a different material from the first electrode layer 11. As an example, the second electrode layer 14 may include TIN, W, Pt, Au, or the like.

The air gap AG may be common to the plurality of protrusions 11B. The air gap AG may be located between the plurality of protrusions 11B. The air gap AG may be an empty space between the plurality of protrusions 11B, and may extend along sidewalls of the protrusions 11B. The air gap AG may be located between the first electrode layer 11 and the switching layer 12. As an example, when the switching layer 12 covers the upper sidewalls of the plurality of protrusions 11B, the air gap AG may be located to correspond to the lower sidewalls of the plurality of protrusions 11B.

According to the structure described above, the memory cell MC may include the first electrode layer 11, the switching layer 12, the oxygen reservoir layer 13, the second electrode layer 14, and the air gap AG. The memory cell MC may be a resistive memory cell. At least one of the first electrode layer 11 and the second electrode layer 14 may include a plurality of protrusions. As an example, the first electrode layer 11 may include the plurality of protrusions 11B. When the switching layer and/or the oxygen reservoir layer are filled in a space between the plurality of protrusions 11B, parasitic capacitance may be formed and noise or signal delay may be caused. Accordingly, according to embodiments of the present disclosure, it is possible to reduce the parasitic capacitance and reduce the noise, the signal delay, or the like, with an air gap AG between the protrusions 11B.

When the first electrode layer 11 includes the plurality of protrusions 11B, an electric field may be concentrated on the plurality of protrusions 11B, and the conductive paths C may be formed to correspond to the plurality of protrusions 11B. Referring to FIG. 1C, the conductive path C may be formed in the switching layer 12 at the tip of the protrusion 11B. When the first electrode layer includes only the base without the protrusions, the oxygen vacancies may be forced to move sporadically and the conductive paths may be formed randomly in the switching layer. Accordingly, by forming the conductive paths C in limited regions using the plurality of protrusions 11B, it is possible to improve the unnecessary movement of the oxygen vacancies and it is possible to improve the reliability of the conductive paths C.

In addition, a magnitude of a forming voltage used in a forming operation may be reduced. The forming operation may be a first set operation for the memory cell MC in an initial state. When the forming operation is performed using a high forming voltage, retention characteristics of the switching layer 12 may deteriorate, and a leakage current may increase due to an overshooting current. Accordingly, it is possible to reduce the forming voltage in disclosed embodiments by including the plurality of protrusions 11B in the first electrode layer 11 to concentrate the electric field at the top of the plurality of protrusions 11B and to reduce the size of the conductive paths C. The forming operation may be performed with a forming voltage having a voltage level similar to that of a set voltage. The retention characteristics of the switching layer 12 may be improved, and the leakage current due to the overshooting current may be reduced.

Figure 2A:
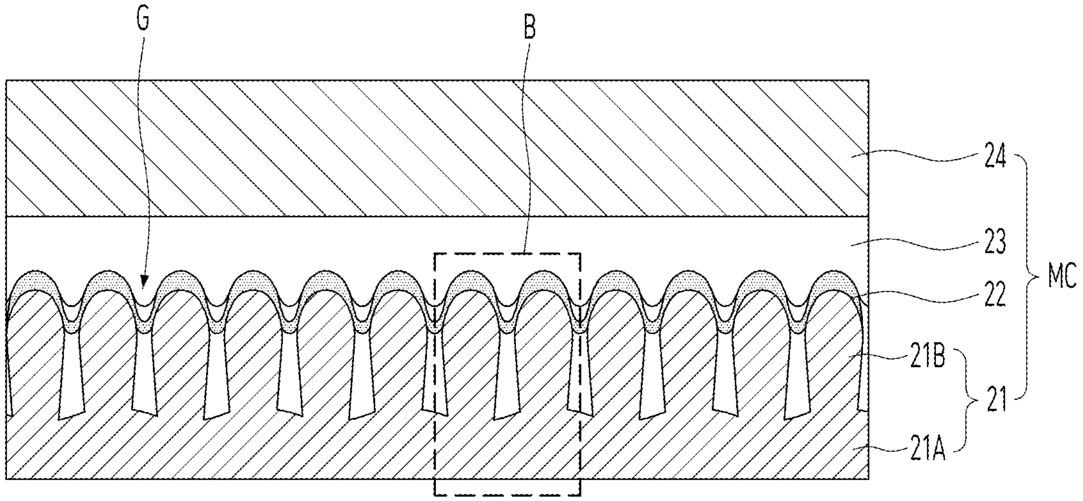
FIGS. 2A and 2B are diagrams for describing a structure of a semiconductor device in accordance with an embodiment.
Figure 2B:
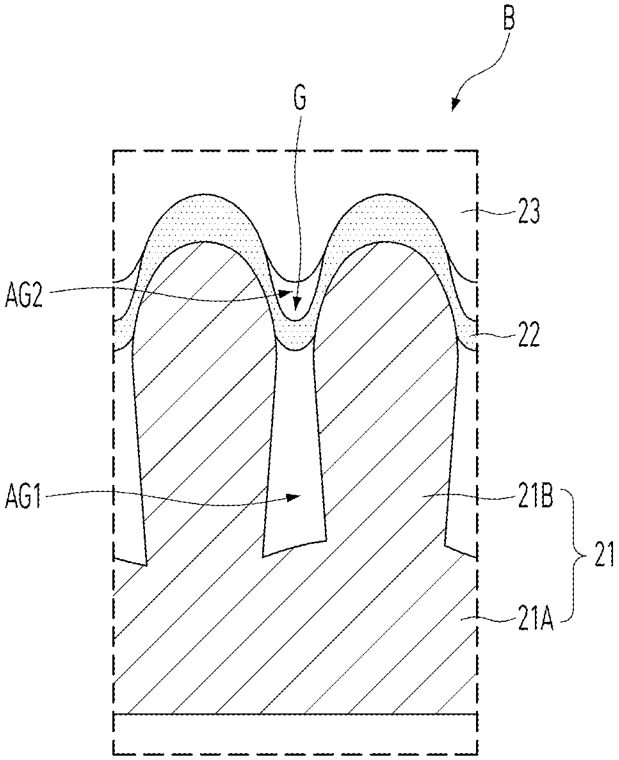

FIGS. 2A and 2B are diagrams for describing a structure of a semiconductor device in accordance with an embodiment of the disclosure. Hereinafter, the content overlapping with the previously described content may be omitted.

Referring to FIGS. 2A and 2B, a semiconductor device may include a memory cell MC. The memory cell MC may include a first electrode layer 21, a switching layer 22, an oxygen reservoir layer 23, and a second electrode layer 24. The memory cell MC may include a first air gap AG1 and a second air gap AG2.

The switching layer 22 may extend along upper profiles of a plurality of protrusions 21B. The switching layer 22 may contact upper profiles of the plurality of protrusions 21B. The switching layer 22 may surround upper sidewalls of the plurality of protrusions 21B, but might not be formed on a surface of a base 21A. The switching layer 22 may be spaced apart from the base 21A. Accordingly, the first air gap AG1 may be located between the first electrode layer 21 and the switching layer 22.

The oxygen reservoir layer 23 may be located on the switching layer 22, and may fill at least a portion of a groove G included in an upper surface of the switching layer 22. When the groove G has a configuration with a small width so that the oxygen reservoir layer 23 cannot fill the lower part of the groove G, a portion of the groove G might not be filled with an oxygen storage material. Instead, a second air gap AG2 may be located between the oxygen reservoir layer 23 and the switching layer 22.

Both the first air gap AG1 and the second air gap AG2 may be located between the plurality of protrusions 21B, and the first air gap AG1 and the second air gap AG2 may be separated from each other by the switching layer 22.

According to the structure described above, the memory cell MC may include both the first air gap AG1 and the second air gap AG2. Because of the second air gap AG2, an area where the protrusions 21B are in contact with the air gaps may be increased and parasitic capacitance may be further reduced.

Figure 3:
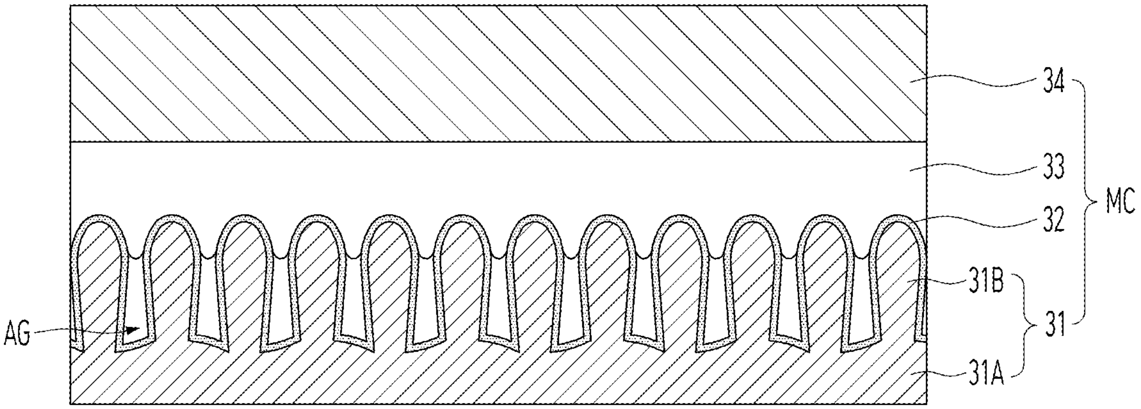
FIG. 3 is a diagram for describing a structure of a semiconductor device in accordance with an embodiment of the disclosure.

FIG. 3 is a diagram for describing a structure of a semiconductor device in accordance with an embodiment of the disclosure. Hereinafter, the content overlapping with the previously described content may be omitted.

Referring to FIG. 3, a semiconductor device may include a memory cell MC. The memory cell MC may include a first electrode layer 31, a switching layer 32, an oxygen reservoir layer 33, and a second electrode layer 34. The memory cell MC may include an air gap AG.

The switching layer 32 may be formed along an upper profile of the first electrode layer 31. The switching layer 32 may entirely surround protrusions 31B, and may contact a surface of a base 31A between the protrusions 31B. The oxygen reservoir layer 33 may be located on the switching layer 32, and may surround tips or top surfaces of the protrusions 31B. The second electrode layer 34 may be located on the oxygen reservoir layer 33.

According to the structure described above, the air gap AG may be located between the switching layer 32 and the oxygen reservoir layer 33, and may extend in the same direction as sidewalls of the protrusions 31B. The air gap AG may expose surfaces of the switching layer 32 and the oxygen reservoir layer 33.

Figure 4A:
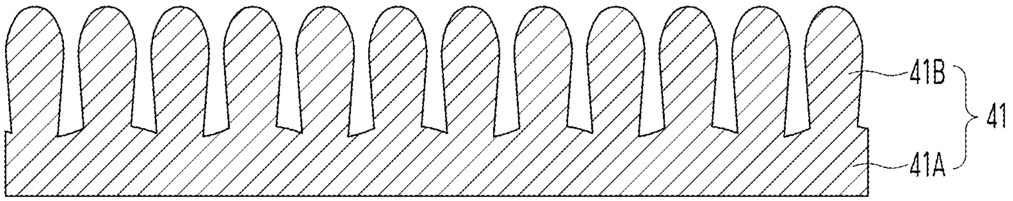
FIGS. 4A to 4C are diagrams describing a method of manufacturing a semiconductor device in accordance with an embodiment of the disclosure.
Figure 4B:
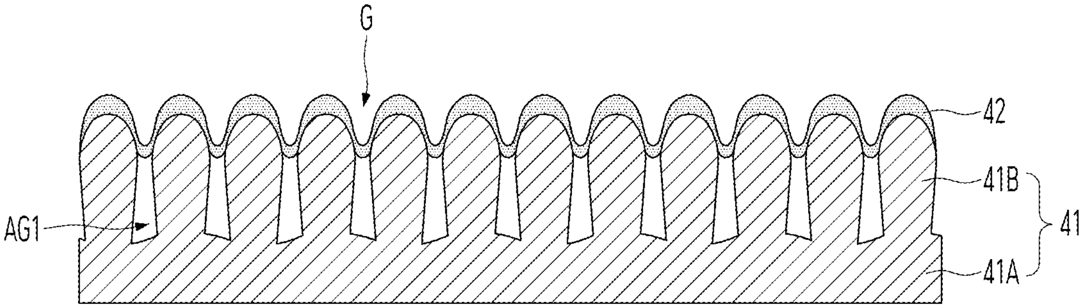
Figure 4C:
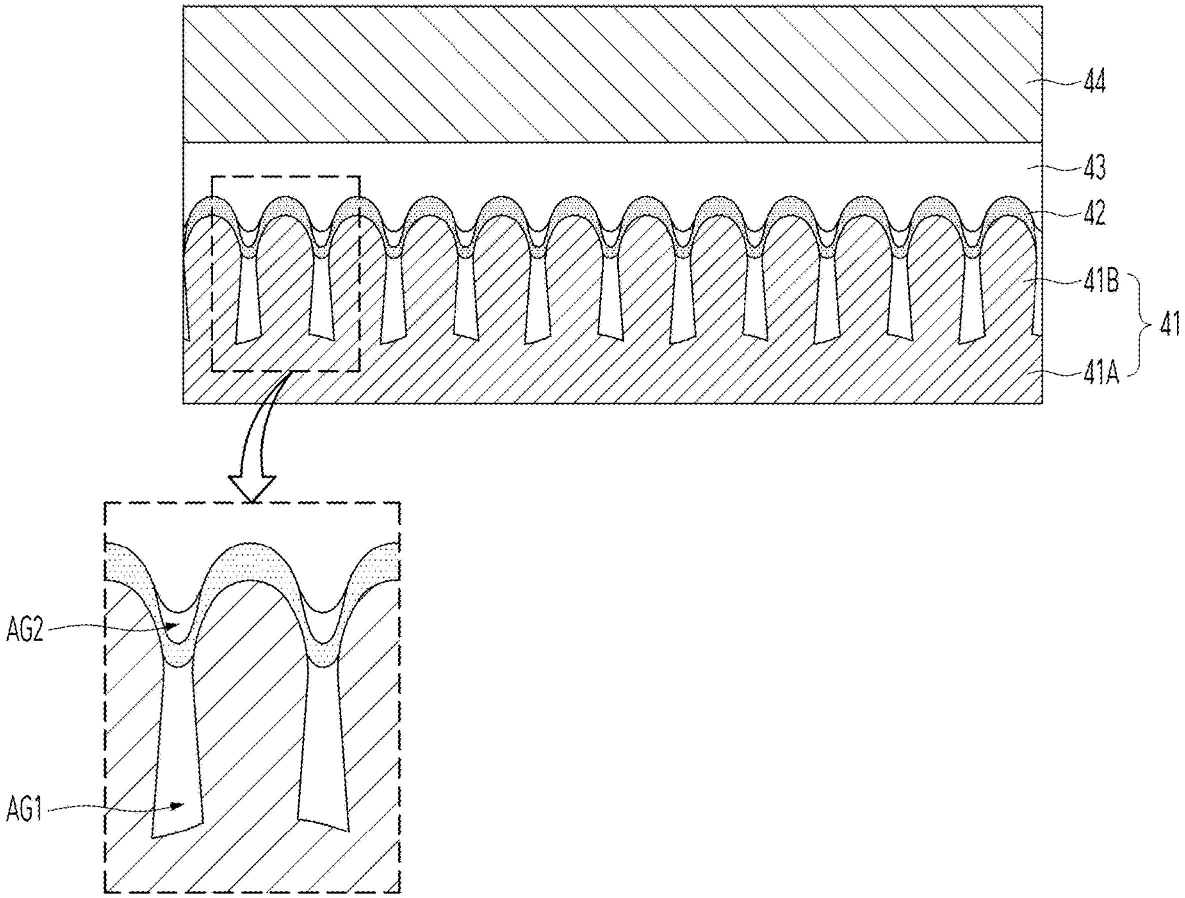

FIGS. 4A to 4C are diagrams describing a method of manufacturing a semiconductor device in accordance with an embodiment of the disclosure. Hereinafter, the content overlapping with the previously described content may be omitted.

Referring to FIG. 4A, a first electrode layer 41 including a base 41A and a plurality of protrusions 41B may be formed. As an example, the first electrode layer 41 may be formed by a sputtering method. A conductive material is deposited by the sputtering method, and accordingly, the protrusions 41B each having a column shape may be formed. The shapes and sizes of the protrusions 41B, the intervals between the protrusions 41B, and other structural characteristics, may be altered by adjusting an angle, a temperature, and the like, used in a sputtering process. The first electrode layer 41 may include TIN, TaN, HfN, or the like.

Referring to FIG. 4B, a switching layer 42 may be formed on the first electrode layer 41. The switching layer 42 may be formed along profiles of the plurality of protrusions 41B. Depending on shapes and spaces of the protrusions 41B, the switching layer 42 may cover surfaces of the protrusions 41B in different shapes. As an example, the switching layer 42 may be formed by a method such as atomic layer deposition (ALD) or physical vapor deposition (PVD). The switching layer 42 may include $HfO_2$, $TiO_2$, $Al_2O_3$, $ZrO_2$, or the like.

The switching layer 42 may entirely or only partially surround or contact the profiles of the plurality of protrusions 41B. An upper surface of the switching layer 42 between the protrusions 41B may include a groove G. The switching layer 42 may be formed to have a uniform thickness or formed to have different thicknesses depending on location or region.

For example, the switching layer 42 may have a relatively greater thickness on a tip of the protrusion 41B, a relatively smaller thickness on a sidewall of the protrusion 41B, and have another thickness between the protrusions 41B.

When the interval between the protrusions 41B is small, a space between the protrusions 41B may be sealed before it is filled with the switching material. The switching layer 42 may surround upper sidewalls of the protrusions 41B, but might not surround lower sidewalls of the protrusions 41B. An empty space may be defined between the protrusions 41B and the switching layer 42, and the empty space that is not filled with the switching material may be defined as a first air gap AG1. The first air gap AG1 may be located between the first electrode layer 41 and the switching layer 42.

Referring to FIG. 4C, an oxygen reservoir layer 43 may be formed on the switching layer 42. As an example, the oxygen reservoir layer 43 may be deposited by a sputtering method. The oxygen reservoir layer 43 may include TIN, W, Pt, Au, or the like.

The oxygen reservoir layer 43 may be formed to fill at least a portion of the groove G. The oxygen reservoir layer 43 may be formed by a method in which step coverage is relatively poor, and an oxygen reservoir material might not be deposited in the entire region of the groove G if the groove G has a small width. An empty space may be defined between the oxygen reservoir layer 43 and the switching layer 42, and the empty space that is not filled with the oxygen reservoir material may be defined as a second air gap AG2. The second air gap AG2 may be located between the oxygen reservoir layer 43 and the switching layer 42. For reference, in other deposition methods used to form the oxygen reservoir layer 43, the oxygen reservoir material may be deposited without the empty space and the second air gap AG2 might not be formed.

Subsequently, a second electrode layer 44 may be formed on the oxygen reservoir layer 43. The second electrode layer 44 may be formed by deposition method, and may include TIN, W, Pt, Au, and the like.

According to the manufacturing method described above, a memory cell including the first electrode layer 41, the switching layer 42, the oxygen reservoir layer 43, and the second electrode layer 44 may be formed. By depositing the switching material on the first electrode layer 41 including the plurality of protrusions 41B, it is possible to form the first air gap AG1 between the first electrode layer 41 and the switching layer 42. By depositing the oxygen reservoir material on a surface of the switching layer 42 by a sputtering method, it is possible to form the second air gap AG2 between the switching layer 42 and the oxygen reservoir layer 43. As a result, it is possible to form a memory cell including the first air gap AG1 and the second air gap AG2, and it is possible to improve operating characteristics of the memory cell.

FIGS. 5A to 5D are diagrams describing a manufacturing method of a semiconductor device in accordance with an embodiment of the disclosure. Hereinafter, the content overlapping with the previously described content may be omitted.

Figure 5A:
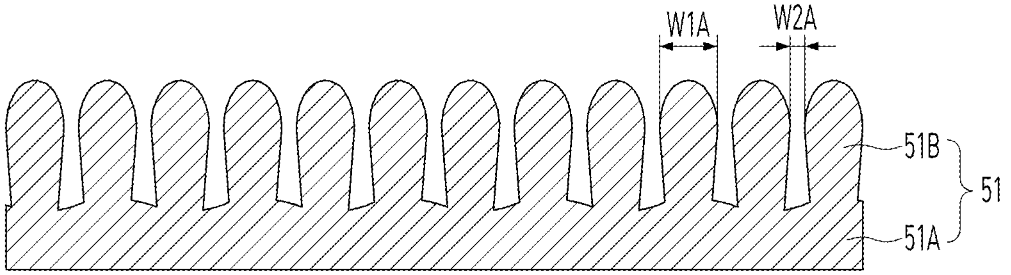
FIGS. 5A to 5D are diagrams describing a manufacturing method of a semiconductor device in accordance with an embodiment of the disclosure.

Referring to FIG. 5A, a conductive layer 51 including a base 51A and a plurality of preliminary protrusions 51B protruding from the base 51A may be formed. Each of the preliminary protrusions 51B may have a width W1A, and adjacent preliminary protrusions 51B may be spaced apart from each other by an interval W2A. The interval W2A between the preliminary protrusions 51B may be smaller than the width W1A of the preliminary protrusions 51B.

Figure 5B:
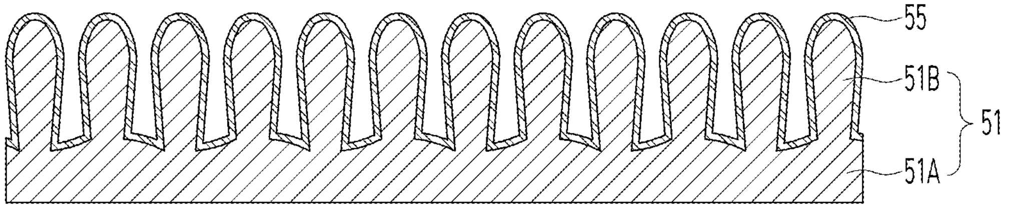

Referring to FIG. 5B, a sacrificial oxide layer 55 may be formed by oxidizing surfaces of the preliminary protrusions 51B. The sacrificial oxide layer 55 may extend along profiles of the preliminary protrusions 51B. A surface of the base 51A may be oxidized between the preliminary protrusions 51B, and the sacrificial oxide layer 55 may extend along a profile of the conductive layer 51.

Figure 5C:
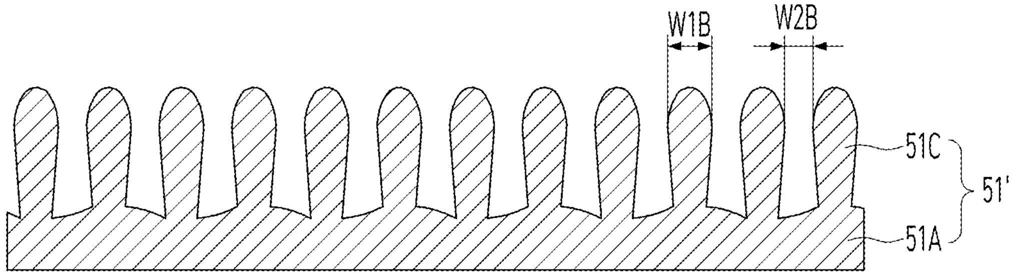

Referring to FIG. 5C, protrusions 51C may be formed by removing the sacrificial oxide layer 55. As an example, the sacrificial oxide layer 55 may be selectively etched using a wet etching or dry etching method. As a result, the protrusions 51C having a smaller size than the preliminary protrusions 51B may be formed, and a first electrode layer 51' including the base 51A and a plurality of protrusions 51C may be formed. A protrusion 51C may have a width W1B smaller than the width W1A. An interval W2B between the protrusions 51C may be larger than the interval W2A between the preliminary protrusions 51B.

Figure 5D:
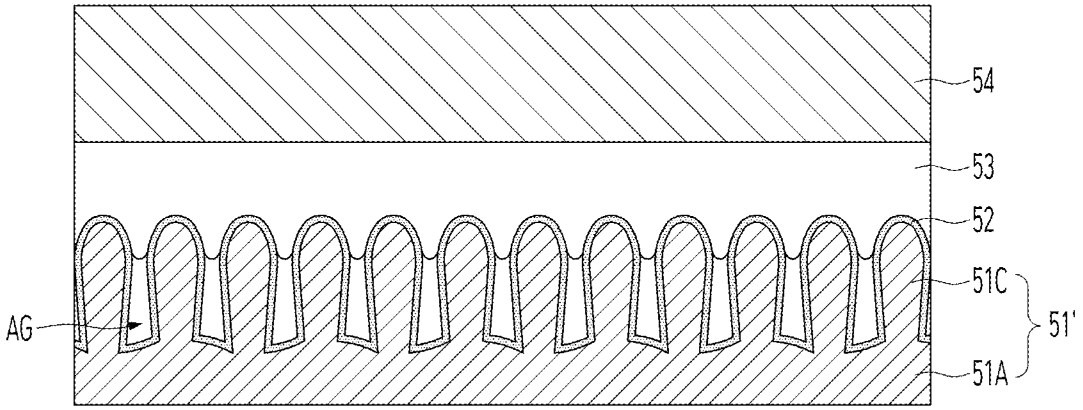

Referring to FIG. 5D, a switching layer 52 may be formed along profiles of the protrusions 51C. By increasing the interval W2B between the protrusions 51C, the switching layer 52 may be formed not only on upper sidewalls of the protrusions 51C but also on lower sidewalls of the protrusions 51C. In addition, the switching layer 52 may also be formed on the surface of the base 51A exposed between the protrusions 51C. The switching layer 52 may be formed along a profile of the first electrode layer 51'.

Subsequently, an oxygen reservoir layer 53 may be formed on the switching layer 52. The oxygen reservoir layer 53 may be formed by depositing an oxygen reservoir material in a method in which step coverage is poor. The oxygen reservoir layer 53 may be formed to surround tips of the protrusions 51C, and a space between the protrusions 51C might not be filled with the oxygen reservoir material. An empty space between the protrusions 51C may be defined as an air gap AG, and the air gap AG may be located between the switching layer 52 and the oxygen reservoir layer 53. Subsequently, a second electrode layer 54 may be formed on the oxygen reservoir layer 53.

According to the manufacturing method described above, the size of the protrusions 51C and the interval W2B between the protrusions 51C may be adjusted through an oxidation process. By reducing the width W1B of the protrusions 51C, it is possible to further concentrate an electric field on the tips of the protrusions 51C. By increasing the interval W2B between the protrusions 51C, it is possible to increase a size of the air gap AG and it is possible to further reduce parasitic capacitance.

Figure 6A:
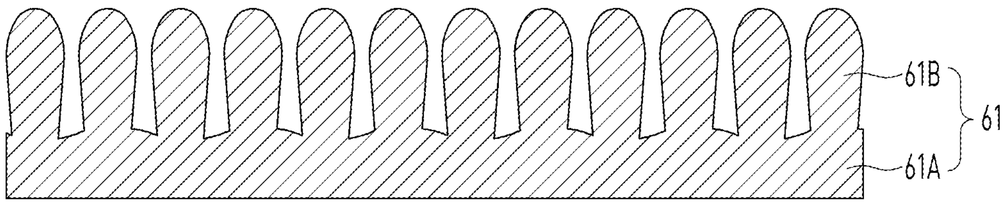
FIGS. 6A and 6B are diagrams describing a manufacturing method of a semiconductor device in accordance with an embodiment of the disclosure.
Figure 6B:
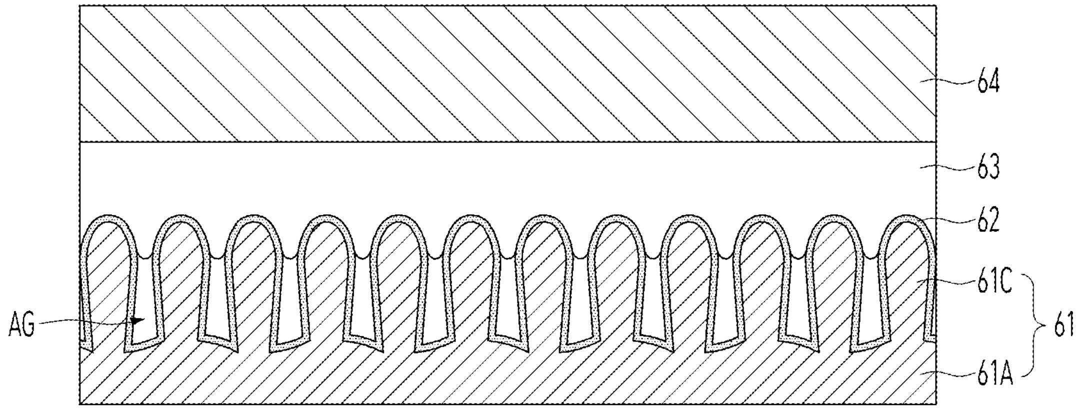

FIGS. 6A and 6B are diagrams for describing a manufacturing method of a semiconductor device in accordance with an embodiment of the disclosure. Hereinafter, the content overlapping with the previously described content may be omitted.

Referring to FIG. 6A, a first electrode layer 61 including a base 61A and protrusions 61B protruding from the base 61A may be formed.

Referring to FIG. 6B, a switching layer 62 may be formed by oxidizing surfaces of the protrusions 61B. As the surfaces of the protrusions 61B are oxidized, protrusions 61C having a reduced size may be formed. A surface of the base 61A exposed between the protrusions 61B may also be oxidized, and the switching layer 62 extending along a profile of the first electrode layer 61 may be formed of the oxidized layer.

As an example, the first electrode layer 61 may include metal nitride, and may include a transition metal. Because the switching layer 62 is formed by oxidizing the first electrode layer 61, the switching layer 62 may include metal oxynitride (MOxNy).

Subsequently, an oxygen reservoir layer 63 may be formed. The oxygen reservoir layer 63 may be formed by depositing an oxygen reservoir material in a method with deliberately poor step coverage. The oxygen reservoir layer 63 may be formed to surround tips of the protrusions 61C, and a space between the protrusions 61C might not be filled with the oxygen reservoir material. An empty space between the protrusions 61C may be defined as an air gap AG, and the air gap AG may be located between the switching layer 62 and the oxygen reservoir layer 63. Subsequently, a second electrode layer 64 may be formed on the oxygen reservoir layer 63.

According to the manufacturing method described above, the switching layer 62 including metal oxynitride may be formed using an oxidation process. Metal oxynitride may have higher thermal stability than metal oxide. In addition, when the switching layer 62 includes nitrogen, the movement of oxygen or the lateral diffusion of oxygen vacancies in the switching layer 62 may be suppressed. Accordingly, reliability of conductive path generation may be secured.

Figure 7:
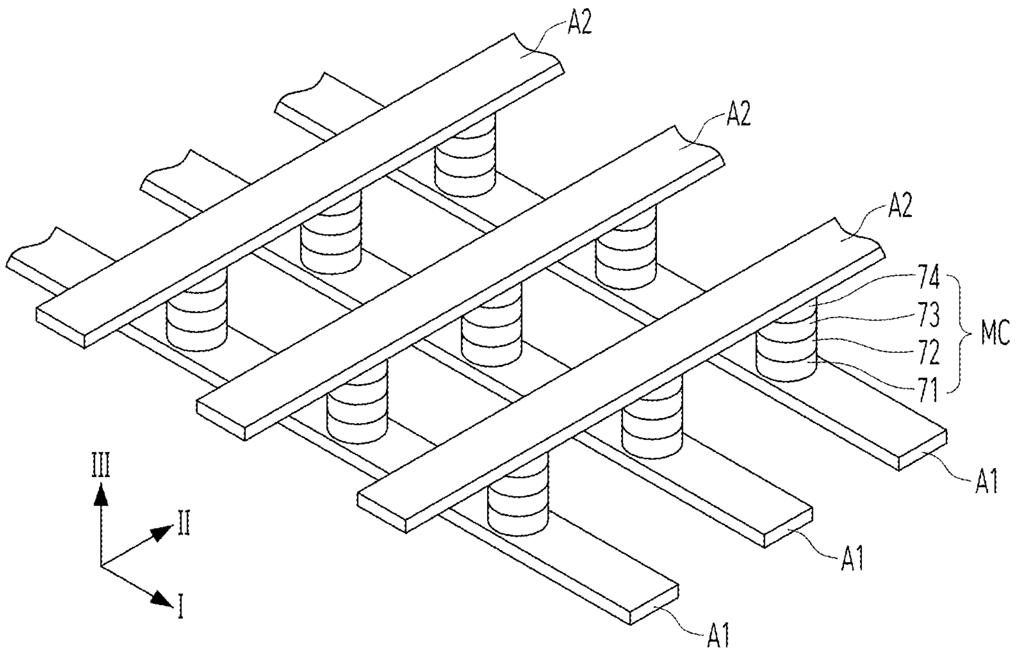
FIG. 7 is a perspective view illustrating the structure of a semiconductor device in accordance with an embodiment of the disclosure.

FIG. 7 is a perspective view illustrating the structure of a semiconductor device in accordance with an embodiment of the disclosure. Hereinafter, the content overlapping with the previously described content may be omitted.

Referring to FIG. 7, a semiconductor device may include at least one first access line A1, at least one second access line A2, and at least one memory cell MC.

The first access line A1 may extend in a first direction I. The second access line A2 may extend in a second direction II intersecting the first direction I. The first access line A1 and the second access line A2 may be stacked in a third direction III. The third direction III may be a direction perpendicular to a plane defined by the first direction I and the second direction II. The first access line A1 and the second access line A2 may each be a word line or a bit line. As an example, the first access line A1 may be a word line, and the second access line A2 may be a bit line. Alternatively, the first access line A1 may be a bit line, and the second access line A2 may be a word line.

The memory cell MC may be located in a region where the first access line A1 and the second access line A2 intersect with each other. The memory cells MC may be arranged in the first direction I and the second direction II. The memory cell MC may be connected between the first access line A1 and the second access line A2.

The memory cell MC may include a first electrode layer 71, a switching layer 72, an oxygen reservoir layer 73, and a second electrode layer 74. Here, the first electrode layer 71 may include a plurality of protrusions, and air gaps may be located between the plurality of protrusions. The first electrode layer 71 may be electrically connected to the first access line A1, and the second electrode layer 74 may be electrically connected to the second access line A2.

In addition, although not illustrated in FIG. 7, the semiconductor device may further include circuits for controlling the first access lines A1 and the second access lines A2. As an example, the semiconductor device may include a first circuit such as a word line decoder and a word line driver. The first circuit may select a first access line on which a program operation is to be performed according to a row address. The semiconductor device may include a second circuit such as a bit line decoder and a bit line driver. The second circuit may select a second access line on which a program operation is to be performed according to a column address. During the program operation, a memory cell MC connected between the selected first access line A1 and the selected second access line A2 may be selected.

According to the structure described above, the memory cell MC may include the first electrode layer 71 including the plurality of protrusions, and the air gaps may be located between the plurality of protrusions. Accordingly, parasitic capacitance may be reduced, and noise, signal delay, or the like, may be reduced.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, changes, and combinations for the embodiments may be made by those skilled in the art, to which the present disclosure pertains, without departing from the technical idea of the present disclosure defined in the following claims, and it should be construed that these substitutions, modifications, changes, and combinations belong to the scope of the present disclosure.

What is claimed is:

1. A semiconductor device comprising:
- a first electrode layer including a base and a plurality of protrusions;
- a switching layer disposed to contact a portion of an upper surface of each of the plurality of protrusions;
- an oxygen reservoir layer disposed on the switching layer;
- a second electrode layer disposed on the oxygen reservoir layer; and
- an air gap common to the plurality of protrusions.

2. The semiconductor device of claim 1, wherein the air gap is between the switching layer and the first electrode layer.

3. The semiconductor device of claim 1, wherein the air gap is between the switching layer and the oxygen reservoir layer.

4. The semiconductor device of claim 1, wherein the air gap comprises:
- a first air gap between the switching layer and the first electrode layer; and
- a second air gap between the switching layer and the oxygen reservoir layer.

5. The semiconductor device of claim 1, wherein the switching layer is disposed on upper sidewalls of the plurality of protrusions.

6. The semiconductor device of claim 1, wherein the switching layer extends along a surface of the base between the plurality of protrusions.

7. The semiconductor device of claim 1, wherein the switching layer includes metal oxide.

8. The semiconductor device of claim 1, wherein the switching layer includes metal oxynitride.

9. The semiconductor device of claim 1, wherein the air gap is located between the plurality of protrusions.

10. A manufacturing method of a semiconductor device, the manufacturing method comprising:
- forming a first electrode layer including a base and a plurality of protrusions protruding from the base;
- forming a switching layer that contacts upper profiles of the plurality of protrusions;
- forming an oxygen reservoir layer on the switching layer; and
- forming a second electrode layer on the oxygen reservoir layer,
- wherein an air gap is defined by sidewalls of the plurality of protrusions.

11. The manufacturing method of claim 10, wherein in the forming of the switching layer, a first air gap is defined between the switching layer and the base by forming the switching layer to surround upper sidewalls of the plurality of protrusions.

12. The manufacturing method of claim 11, wherein in the forming of the oxygen reservoir layer, the oxygen reservoir layer is deposited so that a second air gap is defined between the switching layer and the oxygen reservoir layer.

13. The manufacturing method of claim 10, wherein in the forming of the switching layer, the switching layer is formed to extend along the base exposed between the plurality of protrusions.

14. The manufacturing method of claim 13, wherein in the forming of the oxygen reservoir layer, the air gap is defined between the switching layer and the oxygen reservoir layer by forming the oxygen reservoir layer to surround tips of the plurality of protrusions.

15. The manufacturing method of claim 10, wherein the forming of the first electrode layer comprises:
- forming a conductive layer including the base and a plurality of preliminary protrusions protruding from the base;
- forming a sacrificial oxide layer by oxidizing surfaces of the preliminary protrusions; and
- forming the plurality of protrusions by removing the sacrificial oxide layer.

16. The manufacturing method of claim 10, wherein in the forming of the switching layer, the switching layer is formed by oxidizing surfaces of the plurality of protrusions.

17. The manufacturing method of claim 16, wherein the first electrode layer includes transition metal nitride, and the switching layer includes transition metal oxynitride.

18. The manufacturing method of claim 10, wherein in the forming of the first electrode layer, the first electrode layer is formed by a sputtering method.

19. The manufacturing method of claim 10, wherein in the forming of the switching layer, the switching layer is formed by an atomic layer deposition (ALD) method.

20. The manufacturing method of claim 10, wherein in the forming of the oxygen reservoir layer, the oxygen reservoir layer is formed by a sputtering method.

* * * * *